United States Patent [19]

Hisa

[11] Patent Number: 5,659,562
[45] Date of Patent: Aug. 19, 1997

[54] SEMICONDUCTOR LASER INCLUDING EMBEDDED DIFFRACTION GRATING

[75] Inventor: Yoshihiro Hisa, Itami, Japan

[73] Assignee: Mitsubishi Denki Kabushiki Kaisha, Tokyo, Japan

[21] Appl. No.: 522,121

[22] Filed: Aug. 31, 1995

[30]   Foreign Application Priority Data

Mar. 17, 1995 [JP] Japan ................................ 7-059256

[51] Int. Cl.$^6$ ............................... H01S 3/08; H01S 3/19
[52] U.S. Cl. ............................................. 372/96; 372/45
[58] Field of Search ............................................. 372/96, 45

[56]                References Cited

U.S. PATENT DOCUMENTS

| 5,020,072 | 5/1991 | Abe et al. ............................ 372/96 |
| 5,386,433 | 1/1995 | Ohkura et al. ...................... 372/96 |

FOREIGN PATENT DOCUMENTS

| 0439236 | 7/1991 | European Pat. Off. |
| 0461632 | 12/1991 | European Pat. Off. |
| 0533485 | 3/1993 | European Pat. Off. |
| 0632298 | 1/1995 | European Pat. Off. |
| 2647276 | 11/1990 | France. |
| 4111383 | 4/1992 | Japan. |
| 5136521 | 6/1993 | Japan. |

OTHER PUBLICATIONS

Takemoto et al, "1.3–μm Distributed Feedback Laser Diode With A Grating Accurately Controlled By A New Fabrication Technique", Journal of Lightwave Technology, vol. 7, No. 12, 1989, Dec. pp. 2072–2077.

Nishida et al., "Microloading Effect In InP Wet Etching", Electrochemical Society, vol. 140, No. 8, 1993, pp. 2414–2421.

Tidemand–Petersson et al., "Application Of Selective Area MOVPE For DFB Gratings With Modulated Coupling Coefficient", Materials Research Society Symposium Proceedings, vol. 340, 1994, pp. 153–158.

Primary Examiner—James W. Davie
Attorney, Agent, or Firm—Leydig, Voit & Mayer

[57]           ABSTRACT

A semiconductor laser has a semiconductor substrate, an active layer disposed indirectly on the semiconductor substrate, a barrier layer disposed on the active layer having a larger band gap energy than the active layer, and an embedded diffraction grating of stripes of a semiconductor material, the stripes having a width in a resonator length direction, a length perpendicular to the resonator length direction, and a thickness, and are embedded in the barrier layer. The stripes have a constant pitch along the resonator length direction of the waveguide path, a constant thickness, and a width that changes in the resonator length direction or the width is constant and the thickness is changed.

20 Claims, 15 Drawing Sheets

ETCHING RATE $W_B > W_A$

B PORTION    A PORTION

5,659,562

SEMICONDUCTOR LASER INCLUDING EMBEDDED DIFFRACTION GRATING

FIELD OF THE INVENTION

The present invention relates to a semiconductor laser used for optical communication systems and a method of producing the semiconductor laser.

BACKGROUND OF THE INVENTION

FIG. 18 is a cross-sectional view of a waveguide portion of a distributed feedback semiconductor laser widely used for optical communication that is disclosed in Japanese Unexamined Patent Publication No. Hei-111383. FIG. 18 is a cross-section taken parallel to the path of the laser light wherein a diffraction grating 6, a lower cladding layer 2 of p type InGaAsP, an active layer 3 of InGaAsP, an upper cladding layer 4 of n type InP, and a contact layer 5 of n$^+$ type InGaAsP are successively disposed on a p type InP substrate 1. Further, a $\lambda/4$ phase shift portion 7 is included in the diffraction grating.

When a current flows in the semiconductor laser, light is generated in the active layer 3 due to the recombination of charge carriers. Since the active layer is interposed between the lower cladding layer 2 and the upper cladding layer 4, which have a smaller refractive index than the active layer, the light generated propagates in the active layer 3. The propagated light is reflected at the facets, i.e., end surfaces, and light components having a common phase mutually increase the intensity of light. Further, since the diffraction grating 6 has a distributed feedback structure, light propagating in a substantially uniform mode can be obtained. In addition, since the diffraction grating 6 has the $\lambda/4$ phase shift portion 7, a phase inversion occurs at the $\lambda/4$ shift portion 7 during the propagation of light, and light having a single wavelength is emitted.

In the conventional semiconductor laser as shown in FIG. 18, the intensity of the light is extremely strong at the $\lambda/4$ phase shift portion 7 as shown by the character A in FIG. 20, and so-called hole burning easily occurs, whereby the mode of light may become unstable at a high power light output. In order to suppress hole burning, a structure in which the amplitude of the diffraction grating 6 gradually decreases in the direction of the $\lambda/4$ phase shift portion 7 has been used to reduce the reflectance of light, as shown in FIG. 19. In this structure, an increase of the light intensity at the $\lambda/4$ phase shift portion 7 can be prevented as shown by the line B in FIG. 20.

In order to produce the structure shown in FIG. 19, the p type InP substrate 1 is etched so that the rate of etching is partially or continuously changed whereby the diffraction grating 6 has an amplitude that partially or continuously changes. However, it is very difficult to partially or continuously change the etching rate of the p type InP substrate 1 to form the diffraction grating 6 with partially or continuously changing amplitude. Generally, the pitch of the diffraction grating is in a range of about 0.2–0.3 μm. This structure makes the formation of the diffraction grating 6 still more difficult.

Besides the diffraction grating 6 shown in FIG. 19, there has been proposed an embedded diffraction grating as shown in FIGS. 21 and 22 in Japanese Unexamined Patent Publication No. Hei 2-307287. FIG. 21 shows a semiconductor laser in which, on a p type InP substrate, a buffer layer 8 of p type InP, an active layer 3 of InGaAsP that has a smaller band gap energy than the buffer layer 8, a barrier layer 9 of n type InP that has a larger band gap energy than the active layer 3, an embedded diffraction grating 10 of n type InGaAsP that has a larger band gap energy than the active layer 3 but a smaller band gap energy than the barrier layer 9, an upper cladding layer 4 of n type InP which has the same composition as the barrier layer 9, and a contact layer 5 of n$^+$ type InGaAsP are successively disposed. The diffraction grating 10 has a constant pitch $\Lambda$, a constant width W, and a constant amplitude $d_0$. A $\lambda/4$ phase shift portion 7 is included in the diffraction grating.

FIG. 22 shows a semiconductor laser in which a p type InP substrate 1, an embedded diffraction grating 10 of p type InGaAsP that has a smaller band gap energy than the p type InP substrate 1, a barrier layer 90 of p type InP that has the same composition as the InP substrate 1, an active layer 3 having a smaller band gap energy than the embedded diffraction grating 10, an upper cladding layer 4 of n type InP, and a contact layer 5 of n$^+$ type InGaAsP are successively disposed. The embedded diffraction grating 10 has a constant pitch $\Lambda$, a constant width W, and a constant amplitude $d_0$. A $\lambda/4$ phase shift portion 7 is included in the diffraction grating.

SUMMARY OF THE INVENTION

It is an object of the present invention to eliminate the problems in semiconductor lasers having an embedded diffraction grating as shown in FIGS. 21 and 22, and to provide a semiconductor laser and a method of producing the semiconductor laser including a diffraction grating for easily and accurately producing a stable mode of light propagation with a high power light output.

In one aspect of the invention, a semiconductor laser comprises:
  a semiconductor substrate;
  an active layer above the semiconductor substrate and having a smaller band gap energy than the semiconductor substrate;
  a barrier layer on the active layer, and having a larger band gap energy than the active layer; and
  an embedded diffraction grating including stripes of a material, each stripe having a width in the direction of the waveguide path, a length in a direction perpendicular to the waveguide path, and a height, and embedded between the barrier layer and a cladding layer having the same composition as the barrier layer, extending in a parallel arrangement at a constant pitch along the direction of the waveguide path, wherein the height of the stripe material is constant and the width changes along the waveguide path.

In another aspect of the invention, a semiconductor laser comprises:
  a semiconductor substrate;
  an embedded diffraction grating including stripes of a material and having widths in the direction of the waveguide path, lengths in a direction perpendicular to the waveguide path, and heights, and embedded between the semiconductor substrate, and a barrier layer having the same composition as the semiconductor substrate, extending parallel to and at a constant pitch along the direction of the waveguide path wherein the heights of the stripes are constant and the widths change in the direction of the waveguide path; and
  an active layer on the barrier layer and having a smaller band gap energy than the semiconductor substrate.

In a third aspect of the invention, a semiconductor laser $\lambda/4$ phase shift portion is located in substantially the center of the waveguide path, shifting the phase of the embedded diffraction grating by $\lambda/4$ ($\lambda$: wavelength of light), and the widths of the embedded diffraction grating stripes gradually decrease in the direction of the $\lambda/4$ phase shift portion.

In a fourth aspect of the invention, a semiconductor laser $\lambda/4$ phase shift portion is located in substantially the center of the waveguide path, shifting the phase of the embedded diffraction grating by $\lambda/4$ ($\lambda$: wavelength of light), and the widths of the embedded diffraction grating stripes gradually increase in the direction of the $\lambda/4$ phase shift portion.

In a fifth aspect of the invention a semiconductor laser comprises:

a semiconductor substrate;

an active layer above the semiconductor substrate and having a smaller band gap energy than the semiconductor substrate;

a barrier layer on the active layer, and having a larger band gap energy than the active layer; and an embedded diffraction grating including stripes of a material and having widths in the direction of the waveguide path, lengths in a direction perpendicular to the waveguide path, and heights, embedded between the barrier layer and a cladding layer having the same composition as the barrier layer and extending parallel to and at a constant pitch along the direction of the waveguide path, wherein the widths of the stripes are constant and the heights change in the direction of the waveguide path.

In a sixth aspect of the invention, a semiconductor laser comprises:

a semiconductor substrate;

an embedded diffraction grating including stripes of a material and having widths in the direction of the waveguide path, lengths in a direction perpendicular to the waveguide path, and heights, and embedded between the semiconductor substrate and a barrier layer having the same composition as the semiconductor substrate, extending parallel to and at a constant pitch along the direction of the waveguide path wherein the widths of the stripes are constant and the heights change in the direction of the waveguide path; and an active layer on the barrier layer and having a smaller band gap energy than the semiconductor substrate.

In a seventh aspect of the invention, a semiconductor laser $\lambda/4$ phase shift portion is included in substantially the center of the waveguide path, shifting the phase of the embedded diffraction grating by $\lambda/4$ ($\lambda$: wavelength of light), and the heights of the stripes of the embedded diffraction grating gradually decrease in the direction of the $\lambda/4$ phase shift portion.

In an eighth aspect of the invention, a semiconductor laser $\lambda/4$ shift portion is included in substantially the center of the waveguide path, shifting the phase of the embedded diffraction grating by $\lambda/4$ ($\lambda$: wavelength of light), and the heights of the embedded diffraction grating stripes gradually increase in the direction of the $\lambda/4$ phase shift portion.

In a semiconductor laser according to the invention, the refractive index of the embedded diffraction grating is different from that of the barrier layer.

In a semiconductor laser according to the invention, the band gap energy of the embedded diffraction grating is larger than that of the active layer and smaller than that of the barrier layer.

A method of producing a semiconductor laser comprises:

successively forming on a semiconductor substrate an active layer having a smaller band gap energy than the semiconductor substrate, a barrier layer having a larger band gap energy than the active layer, and an embedded diffraction grating layer;

forming a photoresist on the embedded diffraction grating layer;

exposing and developing the photoresist to form an etching mask having stripe-like openings at a predetermined pitch along the direction of the waveguide path wherein the widths of the openings gradually change in the direction of the waveguide path; and etching portions of the embedded diffraction grating layer exposed by the openings.

A method of producing a semiconductor laser comprises:

forming an embedded diffraction grating layer on a semiconductor substrate;

forming a photoresist on the embedded diffraction grating layer;

exposing and developing the photoresist to form an etching mask having stripe-like openings at a predetermined pitch along the direction of the waveguide path wherein the widths of the openings gradually change in the direction of the waveguide path;

etching portions of the embedded diffraction grating layer exposed by the openings;

covering the embedded diffraction grating layer with a barrier layer having the same composition as the semiconductor substrate; and forming on the barrier layer an active layer having a smaller band gap energy than the semiconductor substrate.

A method of producing a semiconductor laser includes gradually changing the dosage of electron beams in the direction of the waveguide path.

A method of producing a semiconductor laser includes superposing an interference light having a sinusoidal light intensity pattern on a light having an intensity pattern gradually changing in the direction of the waveguide path.

A method of producing a semiconductor laser comprises:

successively forming on a semiconductor substrate an active layer having a smaller band gap energy than the semiconductor substrate, a barrier layer having a larger band gap energy than the active layer, and an embedded diffraction grating layer;

forming a photoresist on the embedded diffraction grating layer;

exposing and developing the photoresist to form an etching mask having stripe-like openings at a predetermined pitch along the direction of the waveguide path wherein the widths of the openings are constant, and the lengths of the openings gradually change in the direction of the waveguide path; and etching portions of the embedded diffraction grating layer exposed by the openings.

A method of producing a semiconductor laser comprises:

forming an embedded diffraction grating layer on a semiconductor substrate;

forming a photoresist on the embedded diffraction grating layer;

exposing and developing the photoresist to form an etching mask having stripe-like openings at a predetermined pitch along the direction of the waveguide path wherein the widths of the openings are constant, and the lengths of the openings gradually change, in the direction of the waveguide path;

etching portions of the embedded diffraction grating layer exposed by the openings;

removing the photoresist and covering the remaining portion of the embedded diffraction grating layer with a barrier layer having the same composition as the semiconductor substrate; and forming on the barrier layer an active layer having a smaller band gap energy than the semiconductor substrate.

A method of producing a semiconductor laser produces a λ/4 phase shift portion in substantially the center portion of the waveguide path, shifting the phase of the embedded diffraction grating by λ/4 (λ: wavelength of light), and the widths of the embedded diffraction grating stripes gradually decrease in the direction of the λ/4 phase shift portion.

A method of producing a semiconductor laser produces a λ/4 phase shift portion in substantially the center portion of the waveguide path, shifting the phase of the embedded diffraction grating by λ/4 (λ: wavelength of light), and the widths of the embedded diffraction grating stripes gradually increase in the direction of the λ/4 phase shift portion.

A method of producing a semiconductor laser comprises:

successively forming on a semiconductor substrate an active layer having a smaller band gap energy than the semiconductor substrate and a barrier layer having a larger band gap energy than the active layer;

forming a heat-resistant film on the barrier layer;

forming first openings in the heat-resistant film wherein the lengths in the direction perpendicular to the waveguide path of the openings gradually change in the direction of the waveguide path;

growing an embedded diffraction grating layer on the barrier layer exposed by the first openings;

removing the heat-resistant film and forming a photoresist on the embedded diffraction grating layer;

exposing and developing the photoresist to form an etching mask having second stripe-like openings arranged at a predetermined pitch along the direction of the waveguide path wherein the widths are constant; and etching the embedded diffraction grating layer exposed by the second openings.

A method of producing a semiconductor laser comprises:

forming a heat-resistant layer on a semiconductor substrate;

forming in the heat-resistant layer first openings wherein the lengths of the openings in the direction perpendicular to the direction of the waveguide path gradually change in the direction of the waveguide path;

growing an embedded diffraction grating layer on the barrier layer exposed by the first openings;

removing the heat-resistant film and forming a photoresist on the embedded diffraction grating layer;

exposing and developing the photoresist to form an etching mask having stripe-like openings arranged at a constant pitch along the waveguide path wherein the widths of the openings are constant;

etching the embedded diffraction grating layer exposed by the openings;

removing the photoresist and covering the remaining portion of the embedded diffraction grating layer with a barrier layer having the same composition as the semiconductor substrate; and forming on the barrier layer an active layer having a smaller band gap energy than the semiconductor substrate.

A method of producing a semiconductor laser produces a λ/4 phase shift opening portion in substantially the center of the waveguide path, shifting the phase of the openings by λ/4 (λ: wavelength of light), wherein the widths of the openings gradually decrease in the direction of the phase λ/4 shift opening portion.

A method of producing a semiconductor laser produces a λ/4 phase shift opening portion in substantially the center of the waveguide path, shifting the phase of the openings by λ/4 (λ: wavelength of light), wherein the widths of the openings gradually increase in the direction of the λ/4 shift opening portion.

A method of producing a semiconductor laser produces a laser with an embedded diffraction grating with a refractive index different from that of the barrier layer.

A method of producing a semiconductor laser produces a laser with an embedded diffraction grating having a band gap energy larger than that of the active layer and smaller than that of the barrier layer.

DETAILED DESCRIPTION OF THE DRAWINGS

Figure 1:
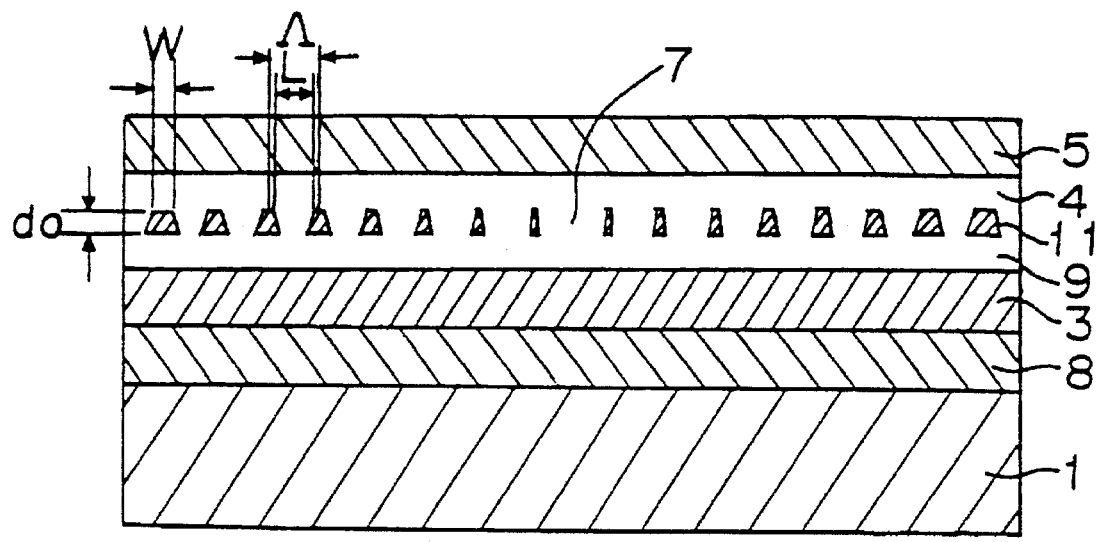
FIG. 1 is a cross-sectional view showing an embodiment of a semiconductor laser according to the present invention.

Preferred embodiments of the present invention will be described with reference to the drawings wherein the same reference numerals designate the same or corresponding parts.

Figure 21:
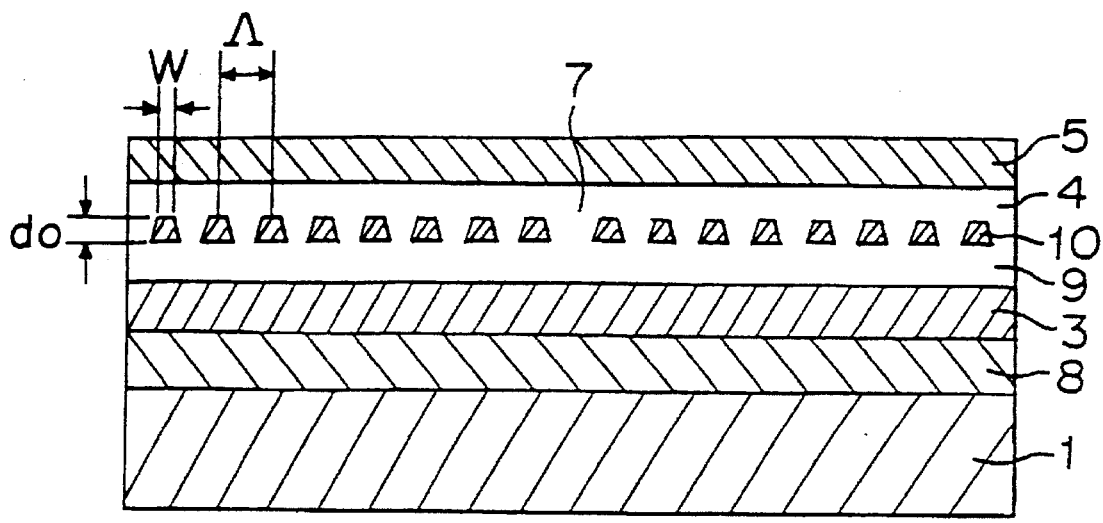
FIG. 21 is a cross-sectional view showing a conventional semiconductor laser.
Figure 22:
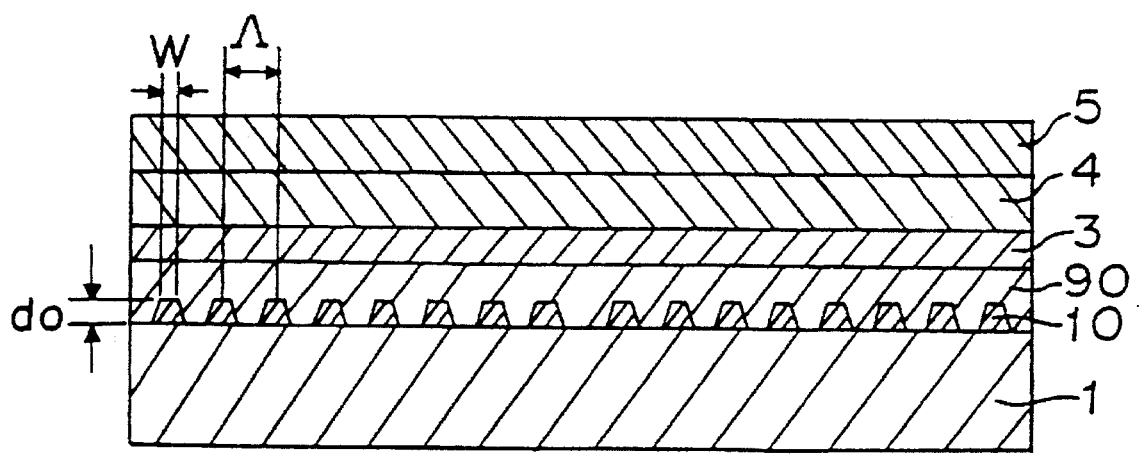
FIG. 22 is a cross-sectional view showing another conventional semiconductor laser.

FIG. 1 is a cross-sectional view showing an embodiment of a semiconductor laser according to the present invention. In FIG. 1, the same reference numerals as in FIG. 21 designate the same or corresponding parts and description of those parts is omitted. Reference numeral 11 designates an embedded diffraction grating formed of stripes of p type InGaAsP. The embedded diffraction grating has a constant pitch $\Lambda$ and a constant amplitude $d_0$, however, the width W of the stripes gradually decreases in the direction of a λ/4 phase shift portion 7. In other words, the embedded diffraction grating 11 has gaps of size L that gradually increase in the direction of the λ/4 phase shift portion 7.

The embedded diffraction grating material 11 has a band gap energy that is larger than the band gap energy of the active layer 3 but smaller than the band gap energy of a barrier layer 9, and the refractive index is different from that of the barrier layer 9 and a buffer layer 4, which has the same composition as the barrier layer 9.

Figure 2:
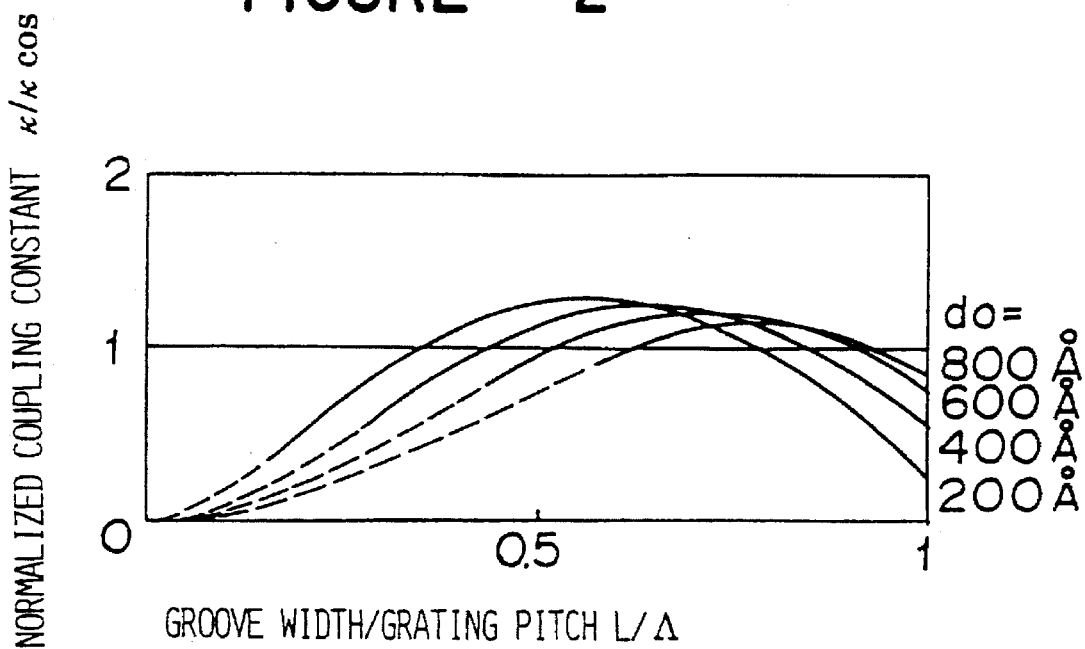
FIG. 2 is a diagram illustrating a function of the semiconductor laser of the first embodiment of the present invention.

FIG. 2 is a diagram showing the relation between an embedded diffraction grating and the reflectance of light disclosed in Journal of Lightwave Technology Vol. 7, No. 12, December, 1989, p 2072. In FIG. 2, the ordinate represents the normalized reflectance of light $\kappa/\kappa_{cos}$. The reflectance $\kappa/\kappa_{cos}$ is a function in which the amplitude $d_0$ of the diffraction grating and the ratio of the gap L of the diffraction grating to the pitch $\Lambda$ of the diffraction grating are used as parameters.

It is understood from FIG. 2 that the reflectance of light can be reduced when the ratio of the gap L of the diffraction grating to the pitch $\Lambda$ of the diffraction grating is made larger or smaller. Namely, in the semiconductor laser shown in FIG. 1, the pitch $\Lambda$ and the amplitude $d_0$ are respectively constant while the width is gradually decreased in the direction of the λ/4 phase shift portion 7, with a result that the gap L of the embedded diffraction grating 11 is gradually increased in the direction of the λ/4 phase shift portion 7.

Using conventional techniques, it was difficult to form the p type InP substrate by means of etching. However, in accordance with this embodiment, that problem is eliminated, and a semiconductor laser having a diffraction grating suppressing hole burning is easily and accurately fabricated.

Figure 3:
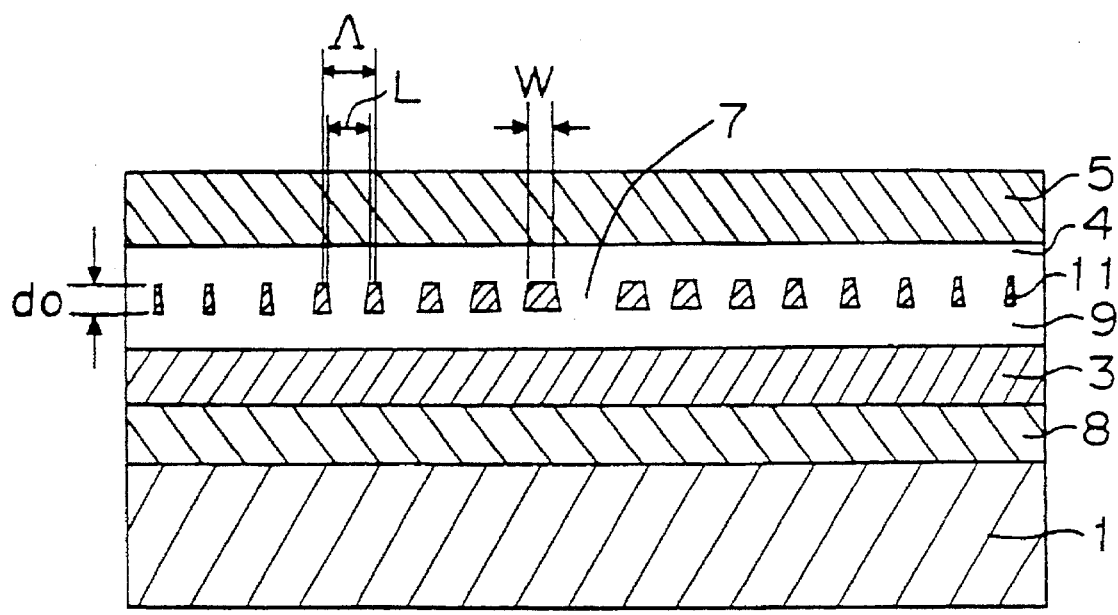
FIG. 3 is a cross-sectional view showing another embodiment of a semiconductor laser according to the present invention.

The semiconductor laser can be modified to have the structure as shown in FIG. 3, as easily understood from the explanation with reference to FIG. 2. Namely, the same effect as in the embodiment shown in FIG. 1 can be obtained in a semiconductor laser so that the pitch $\Lambda$ and the amplitude $d_0$ are constant while the width W gradually increases in the direction of the λ/4 phase shift portion 7. As a result, the dimensions of the gaps L of the embedded diffraction grating 11 are gradually reduced.

Figure 4:
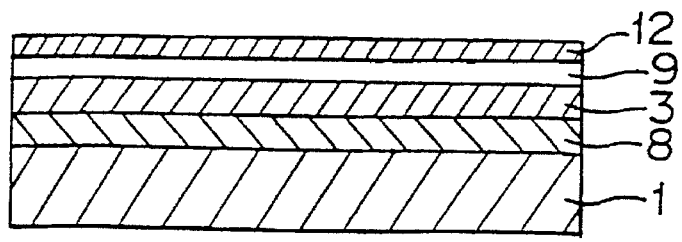
FIGS. 4(a) to 4(d) are cross-sectional views showing steps in producing a semiconductor laser according to an embodiment of the present invention.
Figure 4:
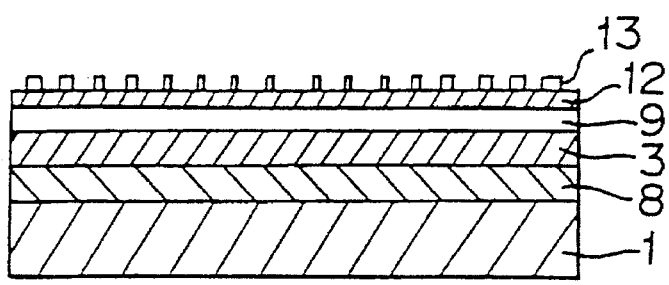
Figure 4:
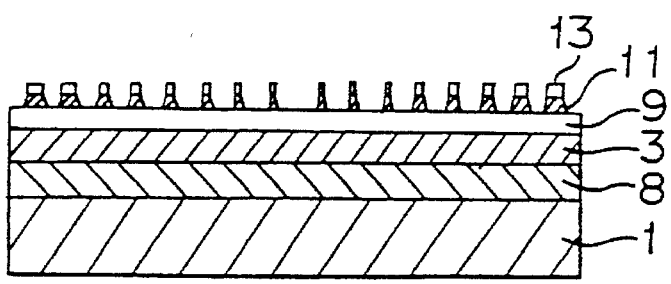
Figure 4:
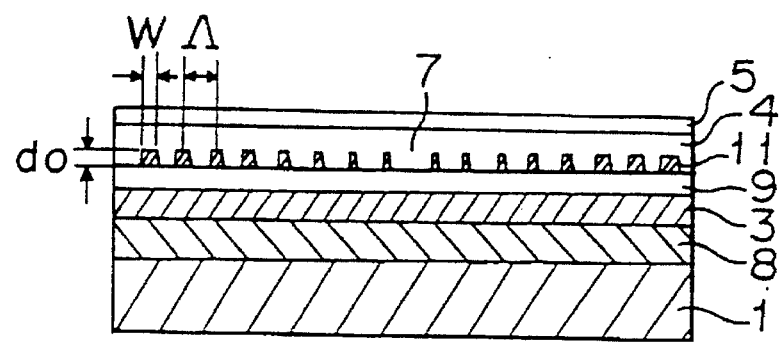

An embodiment of the method of producing a semiconductor laser according to the present invention will be described with reference to FIGS. 4(a) to 4(d). As shown in FIG. 4(a), a buffer layer 8 of p type InP, an active layer 3 of InGaAsP, a barrier layer 9 of n type InP and an embedded diffraction grating layer 12 of n type InGaAsP from which an embedded diffraction grating 11 is formed, are successively epitaxially grown on a p type InP substrate 1.

An etching mask 13 is formed using a photoresist or the like in which the dimensions of openings of the mask 13 gradually increase in the direction of a λ/4 phase shift portion 7 as shown in FIG. 4(b). To form the etching mask 13 for forming a diffraction grating having a fine pitch, an EB (electron beam) direct patterning method, an interference light exposure method using a holographic technique, or an X-ray exposure method can be used. When the EB direct patterning method is used, for instance, a positive photoresist is used and the electron beam dosage is changed whereby the widths of the openings of the etching mask 13 are gradually changed. In order to increase the width of an opening of the etching mask 13, the electron beam dosage should be increased, and in order to reduce the width of an opening, the electron beam dosage should be reduced.

Then, the embedded diffraction grating layer 12 on which the etching mask 13 is formed is etched. As a result, the embedded diffraction grating 11 in which portions of the embedded diffraction grating layer 12 corresponding to the openings of the etching mask 13 are removed, is formed as shown in FIG. 4(c). After the etching mask 13 has been removed, an upper cladding layer 4 of n type InP and a contact layer 5 of n$^+$ type InGaAsP are successively formed on the embedded diffraction grating 11 as shown in FIG. 4(d). Thus, the semiconductor laser with the embedded diffraction grating 11 in which the pitch $\Lambda$ and the amplitude $d_0$ are constant while the width W is gradually changed in the direction of the λ/4 phase shift portion 7 is produced.

Figure 5A:
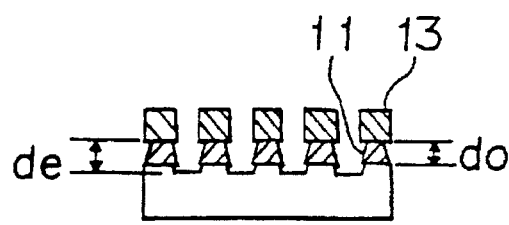
FIGS. 5(a) and 5(b) are cross-sectional views showing how an embedded diffraction grating is formed according to an embodiment of the present invention.
Figure 5B:
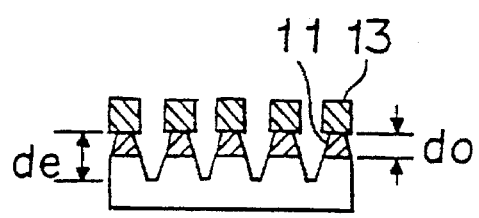

In the method of producing the semiconductor laser described above, since the reflectance of light is controlled by the width W of the embedded diffraction grating 11, the amplitude of the embedded diffraction grating 11 is determined by the thickness of the embedded diffraction grating layer 12 and is constant even though there is some variation in the depth $d_e$ of etching, as shown in FIGS. 5(a) and 5(b). Accordingly, it is unnecessary to control etching carefully as in the conventional techniques, and the diffraction grating 11 is formed easily and accurately.

Figure 6:
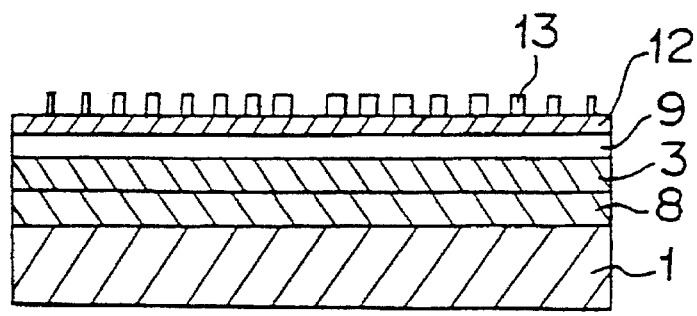
FIG. 6 is a cross-sectional view showing another embodiment of a method of producing a semiconductor laser according to the present invention.

In order to form the semiconductor laser as shown in FIG. 3 in which the pitch $\Lambda$ and the amplitude $d_0$ of the embedded diffraction grating 11 are constant while the width W gradually increases in the direction of the λ/4 phase shift portion 7, whereby the dimensions of the gaps L of the diffraction grating 11 gradually decrease, an etching mask 13 as shown in FIG. 6, in which the dimensions of the openings of the etching mask 13 gradually decrease, can be used. The material used for the embedded diffraction grating 11 has a band gap energy larger than that of the active layer 3 and smaller than the barrier layer 9, or the refractive index is different from that of the barrier layer 9 and the buffer layer 4 which has the same composition as the barrier layer 9.

Figure 7:
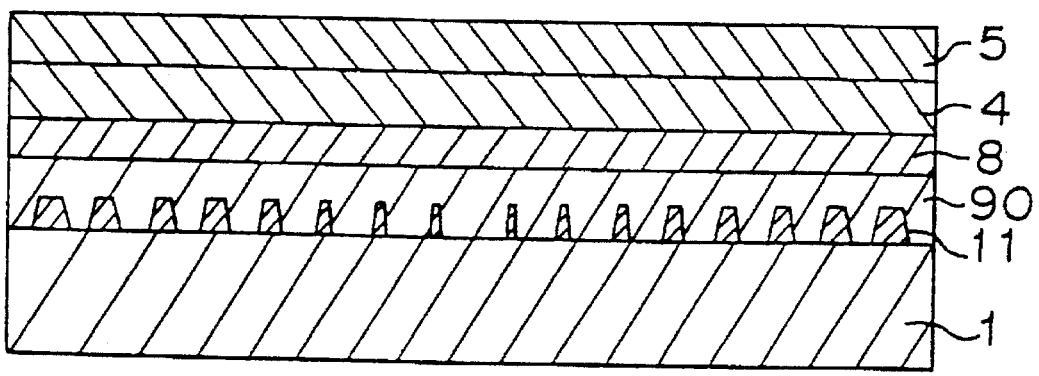
FIG. 7 is a cross-sectional view showing another embodiment of a semiconductor laser according to the present invention.
Figure 8:
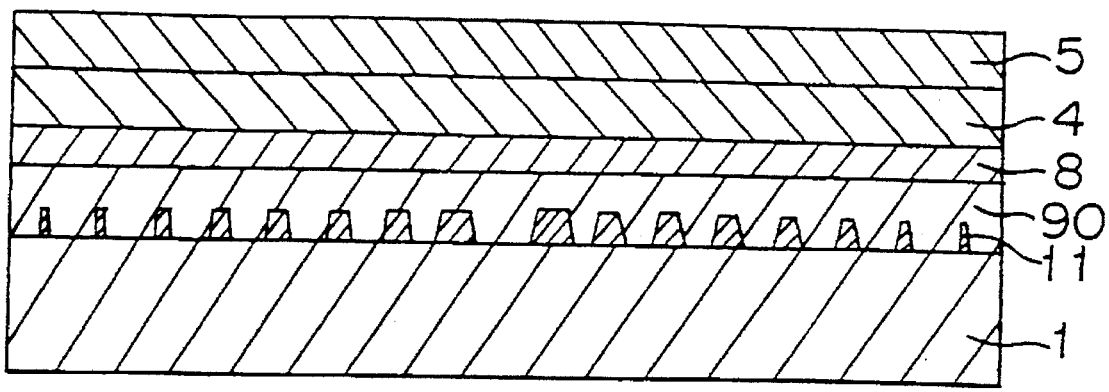
FIG. 8 is a cross-sectional view showing another embodiment of a semiconductor laser according to the present invention.

In the embodiment described above, the embedded diffraction grating 11 is between the barrier layer 9 and the buffer layer 8. However, the same effect is obtainable with a semiconductor laser prepared as follows. As shown in FIGS. 7 and 8, on the p type InP substrate 1, the embedded diffraction grating 11 of p type InGaAsP, a barrier layer 9 of p type InP that has the same composition as the InP substrate 1, the active layer 3 of InGaAsP, the upper cladding layer 4 of n type InP, and the contact layer 5 of $n^+$ type InGaAsP are successively arranged wherein the pitch $\Lambda$ and the amplitude $d_0$ of the embedded diffraction grating 11 are constant and the width W changes in the direction of the $\lambda/4$ phase shift portion 7. In this structure, the embedded diffraction grating 11 has a band gap energy larger than that of the active layer 3 but smaller than that of the barrier layer 9, or the refractive index is different from that of the barrier layer 9.

In these embodiments an p type InP substrate is used. However, in the present invention, a semi-insulating InP substrate or an n type InP substrate may be used. Further, another material such as a GaAs series material can also be used.

Figure 9:
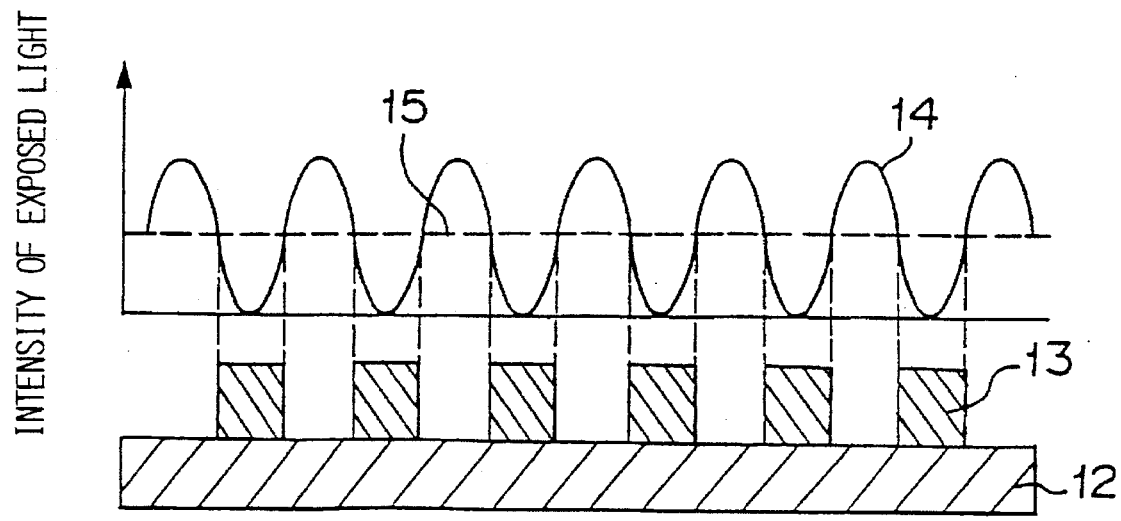
FIGS. 9(a) to 9(c) are diagrams for explaining another embodiment of a method of producing a semiconductor laser according to the present invention.
Figure 9:
Figure 9:
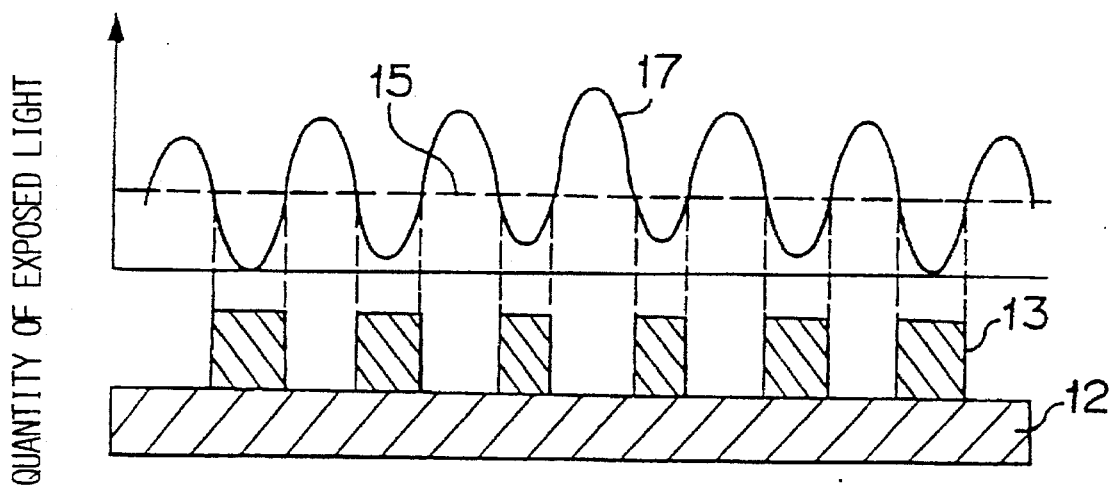

A second embodiment of the present invention will be described. Instead of producing a semiconductor laser with EB direct patterning as described for the first embodiment, an interference light exposure method is used in this embodiment, described with reference to FIGS. 9(a) to 9(c). A positive photoresist is used for the etching mask 13 shown in FIG. 4(b), and interference light exposure with a sinusoidal wave light exposure pattern is used for a first light exposure 14 as shown in FIG. 9(a). Areas irradiated with light having an intensity exceeding a dissolving point 15 are dissolved at the time of development, whereby an etching mask 13 having a uniform shape is formed as shown in FIG. 9(a).

A feature of the present invention is to gradually change the width of the embedded diffraction grating 11. Accordingly, the width of the etching mask 13 should gradually change. For this purpose, a second light exposure with the intensity distribution 16 shown in FIG. 9(b) is conducted after the interference light exposure. In the second light exposure, the intensity of the light gradually increases in the direction of the central portion as shown in FIG. 9(b). The total light exposure of the photoresist is shown in FIG. 9(c) which shows a light exposure pattern 17 in which the peak strength of a sinusoidal wave is gradually increased toward a central portion, whereby the widths of openings in the etching mask 13 after the development gradually increase.

The light exposure can also use an intensity of light that gradually decreases in the direction of the central portion whereby the widths of openings of the etching mask 13 after development are gradually reduced. An interference light exposure device is much cheaper than an electron beam direct patterning device, and the cost of producing products can be remarkably decreased using interference light exposure.

In this embodiment, the second light exposure, after the interference exposure light, gradually changes the intensity of exposure light. However, the two light exposures can be made simultaneously if the intensity of the interference light exposure has the proper distribution. To produce the exposure light distribution, a beam splitter that provides a different reflectance at a local area may be placed at a predetermined angle in the light path, or a slit may be successively moved to change the duration of light exposure, with the result that the desired exposure light intensity distribution is obtained.

In the first and the second embodiments, the width of the diffraction grating is controlled by gradually changing the widths of the openings of the etching mask. In the third embodiment, the width of the diffraction grating is controlled by utilizing the micro-loading effect.

Figure 10:
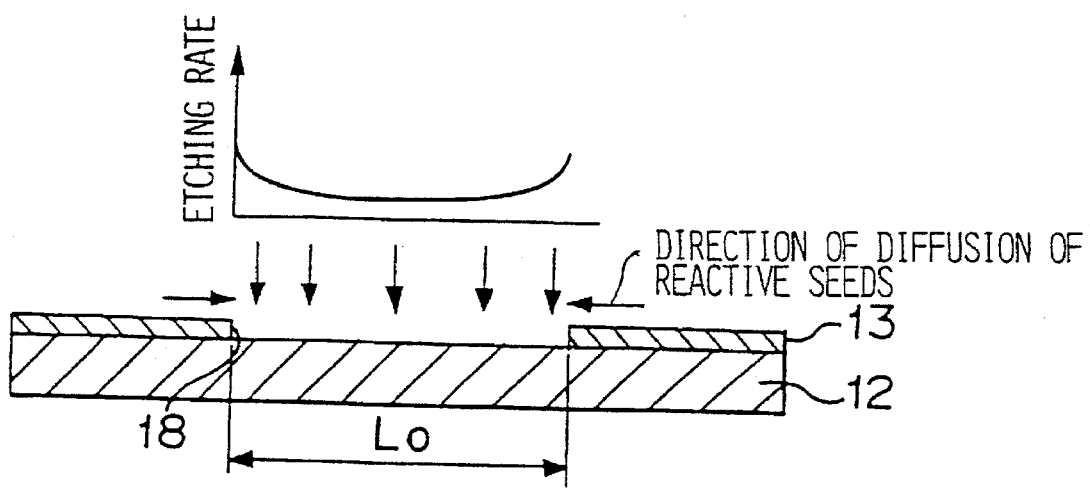
FIGS. 10(a) and 10(b) are cross-sectional views for explaining the micro-loading effect.
Figure 10:
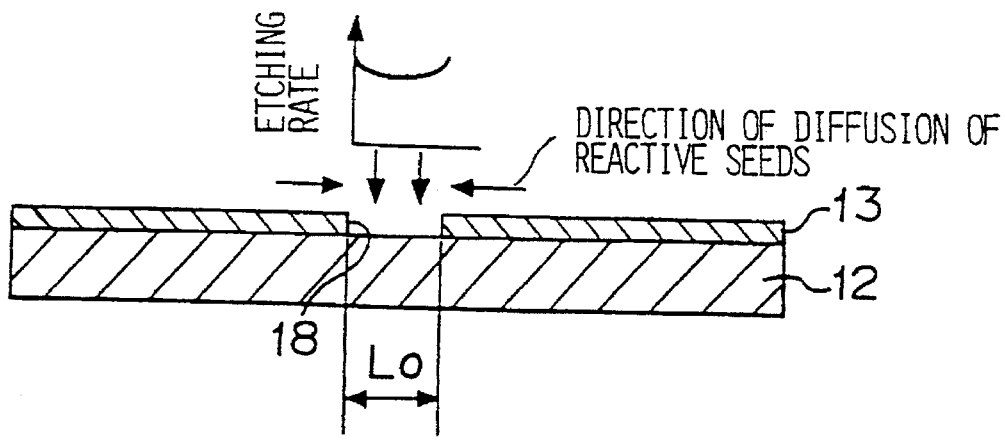

First, an explanation of the micro-loading effect is given with reference to the cross-sectional views of FIGS. 10(a) and 10(b). In these figures, numeral 18 designates an opening in the etching mask 13. The exposed portion of the embedded diffraction grating layer 12 of InGaAsP, exposed at an opening 18 in the etching mask 13, has grown on it reactive crystalline growth seeds. Since the growth reaction does not take place on the etching mask 13, the concentration of the growth seeds becomes higher in the opening, because the reactive seeds diffuse to the opening portion 18 where the growth and etching reactions take place. Accordingly, as shown in FIG. 10(a), when the length $L_0$ of the opening 18 is large, the rate of etching near the edge of an opening 18, i.e., the edge of the etching mask 13, is higher than elsewhere within the opening.

As shown in FIG. 10(b), when the length $L_0$ of the opening 18 is smaller, the rate of etching at the edge 18 of the opening becomes high due to the reactive seeds that diffuse from the etching mask 13. This phenomenon is called the micro-loading effect and takes place in both wet etching or dry etching. It is sufficient to form the diffraction grating only in the waveguide path. Further, since the width of the waveguide path is at most about 1 μm, the micro-loading effect is easily obtained.

Figure 11:
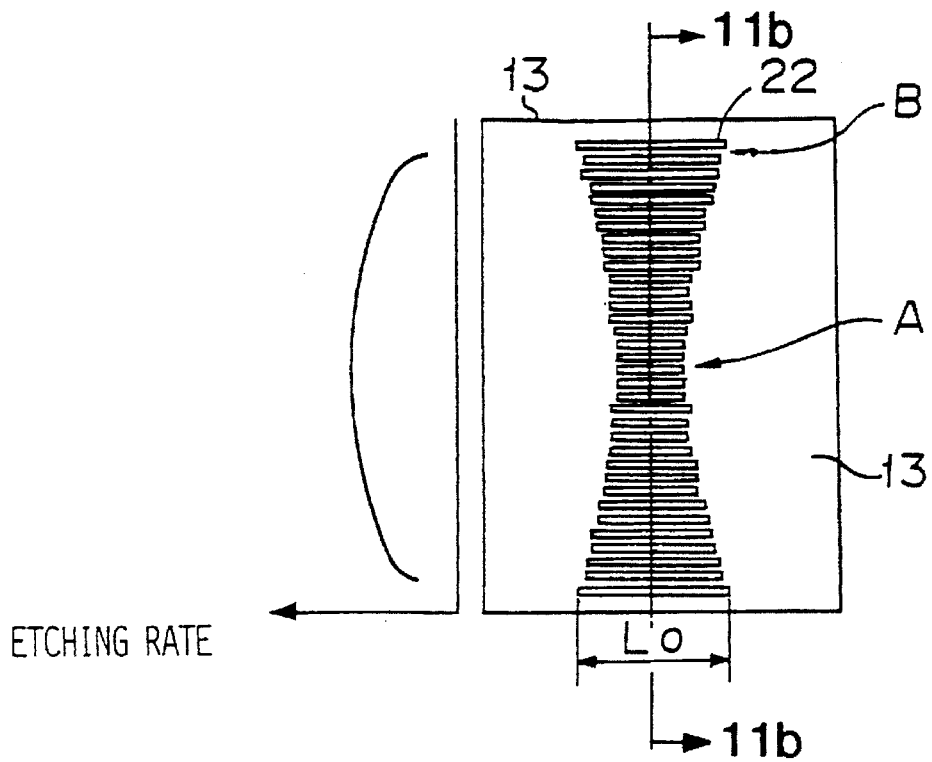
FIGS. 11(a) and 11(b) are, respectively, a plan view and a cross-sectional view for explaining another embodiment of a method of producing a semiconductor laser according to the present invention.
Figure 11:
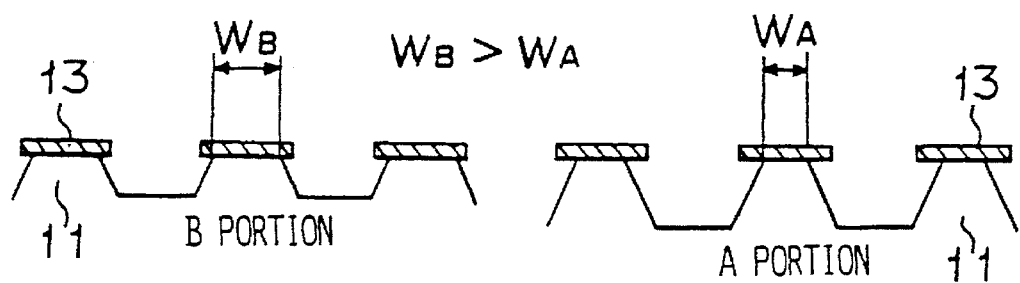

FIGS. 11(a) and 11(b) are, respectively, a plan view showing a pattern of the openings 18 of the etching mask 13 and a cross-sectional view taken along a line 11b—11b that shows etching of the guide layer 12 at a peripheral portion B and the central portion A of the opening 18. In FIG. 11(a), the rate of etching corresponding to each position along line 11b—11b is shown.

As shown in FIG. 11(a), the length $L_0$ of the openings 18 become smaller toward the center of the mask. Accordingly, the rate of etching becomes larger, due to the micro-loading effect, approaching the center. As shown in FIG. 11(b), undercut portions are produced below the etching portion 13. Since the amount of each of the undercuts becomes larger as the etching rate becomes larger, the width $W_A$ at the central portion A of the embedded diffraction grating 11 is smaller than the width $W_B$ at a peripheral portion B of the grating 11. Since the etching rate becomes larger from the peripheral portion B to the central portion A, the width of the embedded diffraction grating 11 becomes smaller in the direction from the peripheral portion B to the central portion A.

In accordance with the method of producing the semiconductor laser in this embodiment, the spacing of the openings 18 of the etching mask 13 in the direction of the waveguide path is constant. Accordingly, it is easy to form the etching mask 13.

In the first to the third embodiments, the reflectance of light is changed by controlling the width of the embedded diffraction grating. In a fourth embodiment, however, the reflectance of light is changed by adjusting the amplitude of the embedded diffraction grating.

Figure 12:
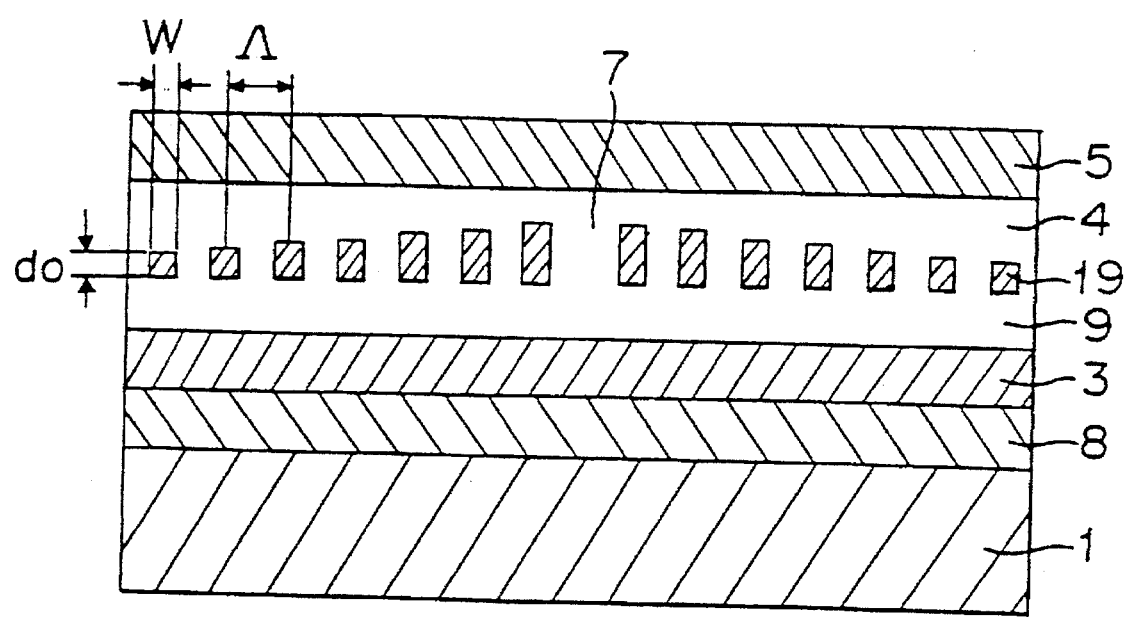
FIG. 12 is a cross-sectional view showing another embodiment of a semiconductor laser according to the present invention.

FIG. 12 is a cross-sectional view showing the structure of a semiconductor laser according to the fourth embodiment wherein the same reference numerals as in FIG. 1 designate the same or corresponding parts and description of these parts is omitted.

In FIG. 12, reference numeral 19 designates an embedded diffraction grating of n type InGaAsP with a constant pitch Λ and width W, and an amplitude do that gradually increases in the direction of the λ/4 phase shift portion 7. It is understood from FIG. 2 that, for instance, when the ratio of the distance L to the pitch of the diffraction grating is 0.5, the reflectance becomes smaller as the amplitude $d_0$ increases. Accordingly, in the structure of the semiconductor laser shown in FIG. 12, the reflectance of light at the central portion of the semiconductor laser is decreased. Accordingly, the occurrence of hole burning is suppressed even when the light output power is increased.

The amplitude of the embedded diffraction grating 19 is determined by controlling the thickness of the layer when it is grown. In the method according to this embodiment, the control of the thickness of the grown layer can be extremely accurate, and the performance of the semiconductor laser produced is remarkably improved.

Figure 13A:
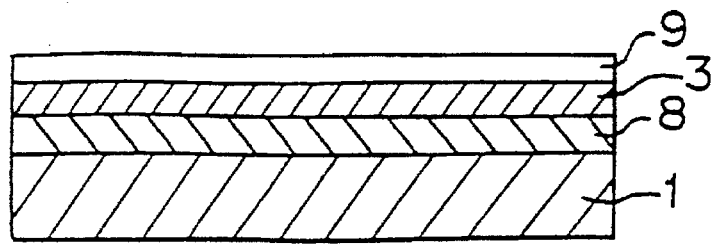
FIGS. 13(a) to 13(e) are diagrams for explaining another embodiment of a method of producing a semiconductor laser according to the present invention.
Figure 13B:
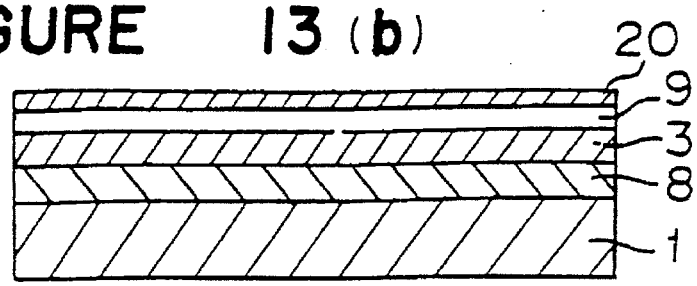
Figure 13C:
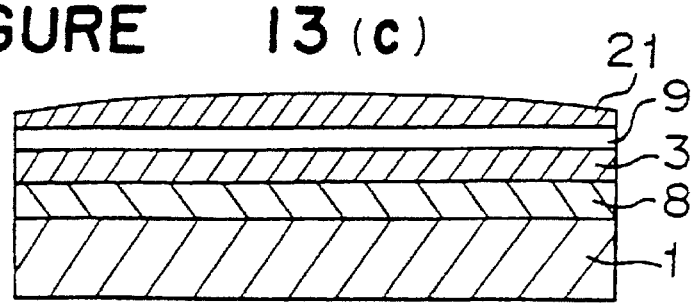
Figure 13D:
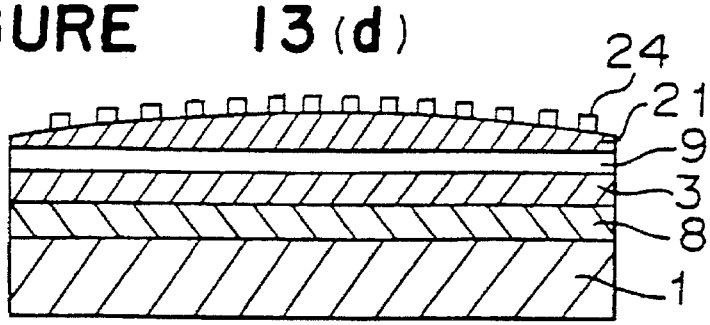
Figure 13E:
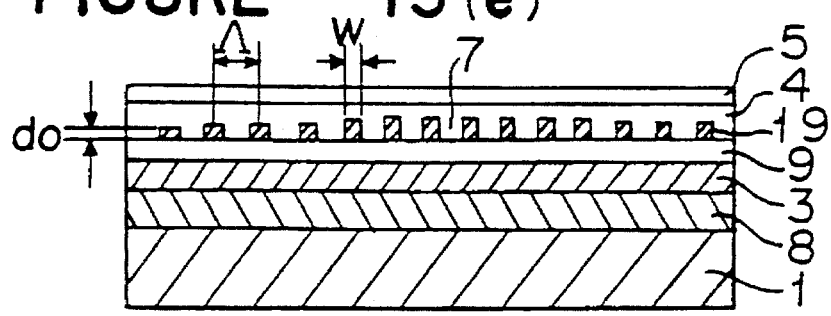
Figure 14A:
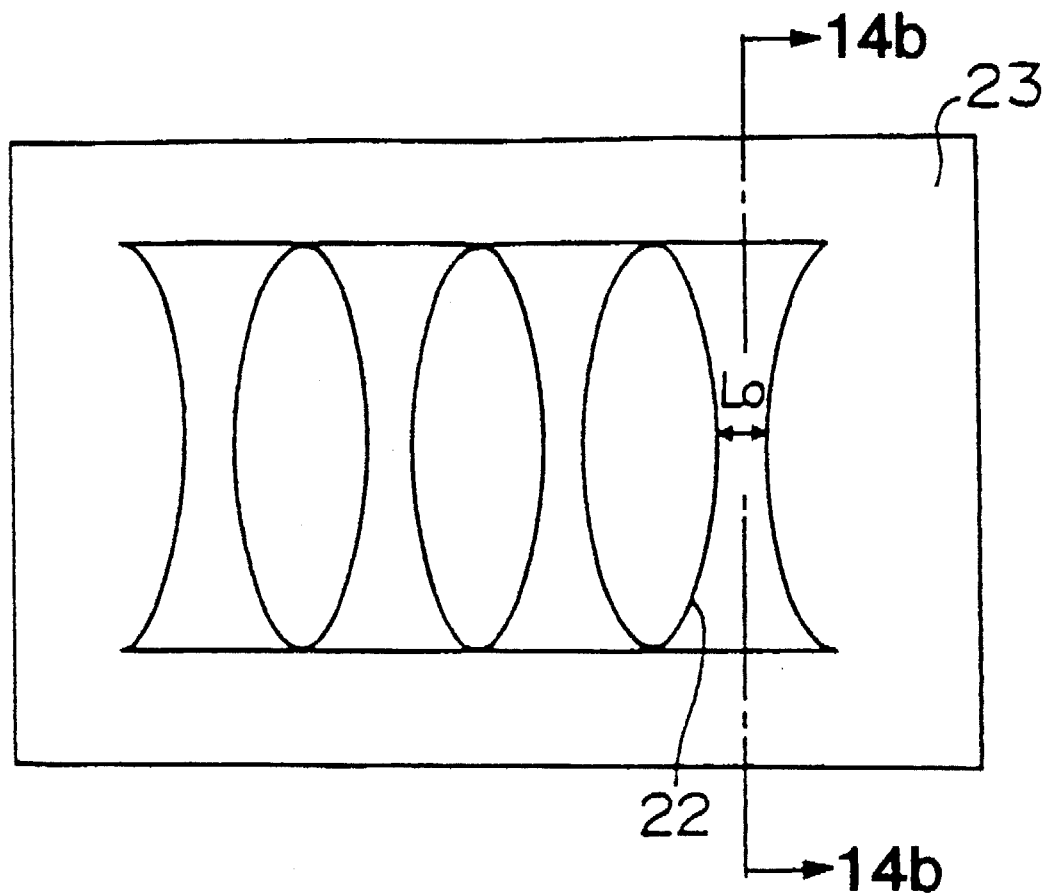
FIGS. 14(a) and 14(b) are, respectively, a plan view and a partial cross-sectional view which show a mask for crystal growth used in a method of producing a semiconductor laser according to the present invention.

FIGS. 13(a) to 13(e) are, respectively, cross-sectional views showing steps of producing the semiconductor laser shown in FIG. 12, and FIG. 14(a) is a plan view showing a mask for crystal growth. As shown in FIG. 13(a), the buffer layer 8 of p type InP, the active layer 3 of InGaAsP, and the barrier layer 9 of n type InP are successively grown on the p type InP substrate 1.

Figure 14B:
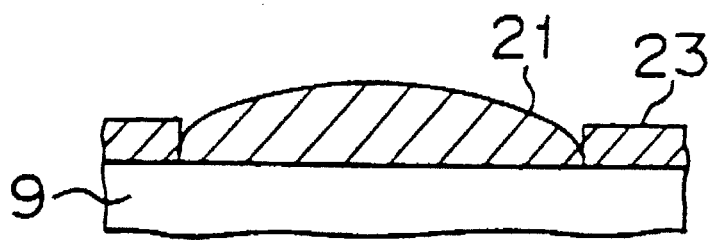

Prior to the growth of an embedded diffraction grating layer 21 of n type InGaAsP, a $SiO_2$ film 20 is formed on the barrier layer 9. Then, the $SiO_2$ film 20 is etched, using a photoresist or the like, whereby a mask 23 for crystal growth that has openings arranged in a pattern with widths between adjacent openings 22 gradually narrowing in the direction of the central portion of the waveguide path (14b—14b direction), is formed as shown in FIG. 14(a). For the formation of the openings 22, an electron beam direct patterning method using a photoresist, an interference light exposure method utilizing a holographic technique, or an X-ray exposure method can be used. After the mask for crystal growth 23 has been formed with the $SiO_2$ film 20, the photoresist is removed, followed by the growth of the n type InGaAsP layer whereby the embedded diffraction grating layer 21 of n type InGaAsP is formed. Since there is no crystal growth on the mask 23, the concentration of crystal seeds is relatively high at a central portion where the distance between adjacent openings of the mask 23 is small, whereby the rate of crystal growth at the central portion of the openings 22 becomes relatively high. As a result, the thickness of the diffraction grating layer 21 in a cross-sectional view taken along the line 14b—14b is increased from its edges to the central portion as shown in FIG. 14(b). Thus, the embedded diffraction grating layer 21 having a height increased in the direction of the central portion as shown in FIG. 13(c) is formed.

The etching mask formed of a photoresist 24, which has stripe-like openings with a constant pitch, a constant width, and parallel to each other in the direction of the waveguide path, is formed by using an EB direct patterning method, an interference light exposure method utilizing a holographic technique, or an X-ray exposure method, followed by etching the embedded diffraction grating layer 21 as shown in FIG. 13(d). The photoresist 24 is removed. Thereafter, the upper cladding layer 4 of InP and the contact layer 5 of InGaAsP are successively formed as shown in FIG. 13(e), whereby a semiconductor laser having the diffraction grating 19 with constant pitch Λ and width W and an amplitude $d_0$ that gradually increases in the direction of the λ/4 phase shift portion 7, is produced.

Figure 15:
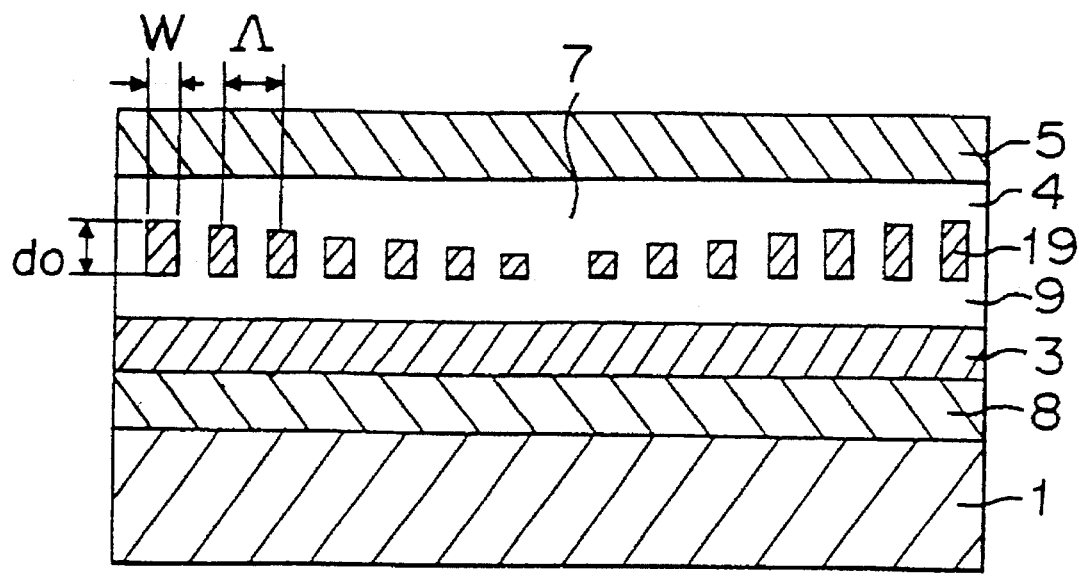
FIG. 15 is a cross-sectional view showing another embodiment of a semiconductor laser according to the present invention.

As is understood from description concerning FIG. 2, the same effect is obtainable even in a semiconductor laser in which that the pitch Λ and the width W are both constant and the amplitude $d_0$ gradually decreases in the direction of the λ/4 phase shift portion 7, as shown in FIG. 15. The material used for the embedded diffraction grating 19 has a band gap energy larger than that of the active layer 3 but smaller than that of the barrier layer 9, or the refractive index is different from the that of the barrier layer 9 and the buffer layer 8 that has the same composition as the barrier layer 9.

Figure 16:
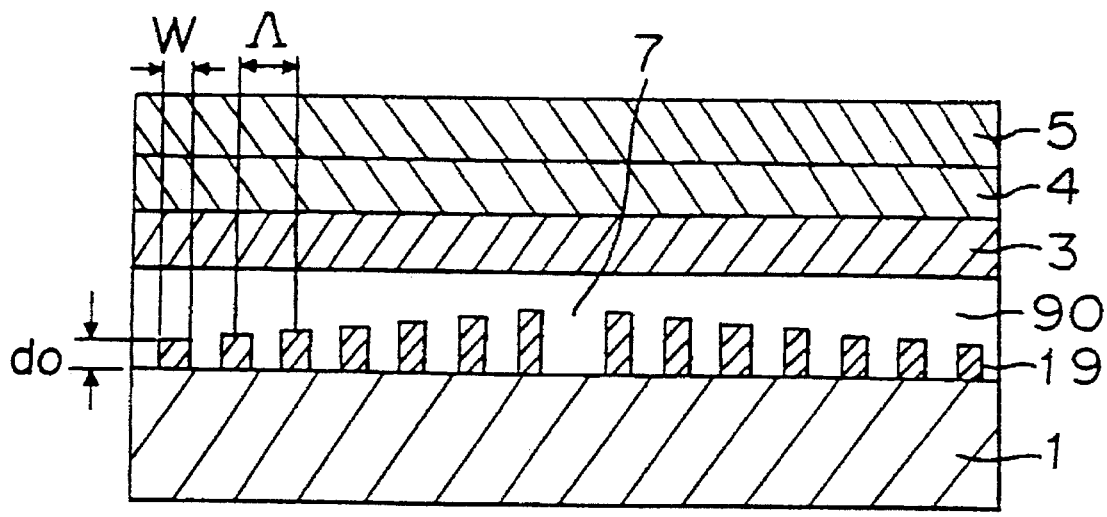
FIG. 16 is a cross-sectional view showing another embodiment of a semiconductor laser according to the present invention.
Figure 17:
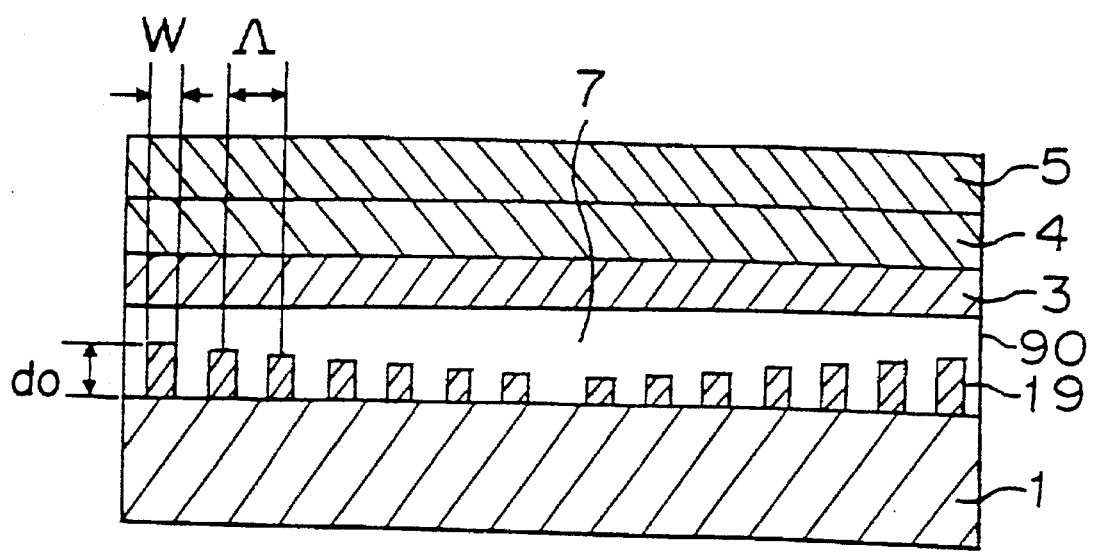
FIG. 17 is a cross-sectional view showing another embodiment of a semiconductor laser according to the present invention.
Figure 18:
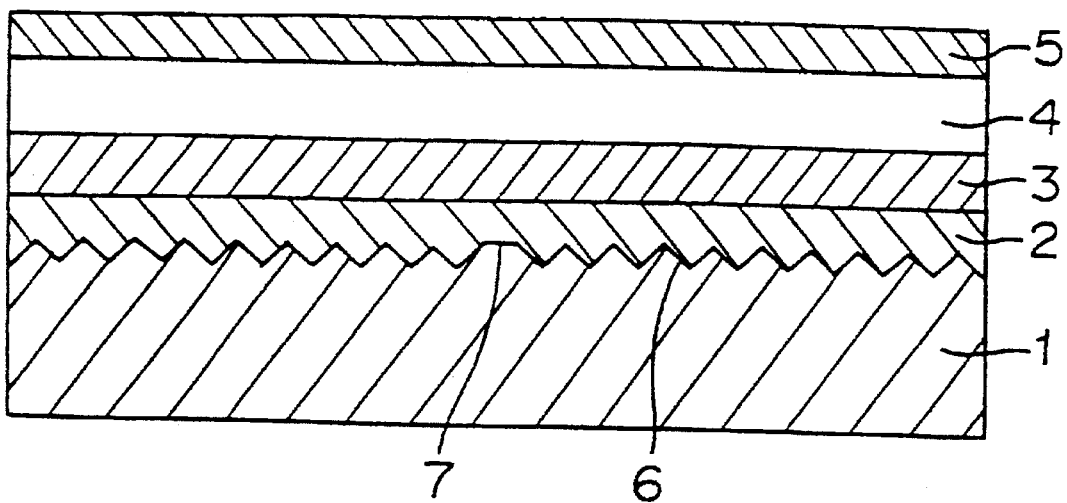
FIG. 18 is a cross-sectional view showing a conventional semiconductor laser.
Figure 19:
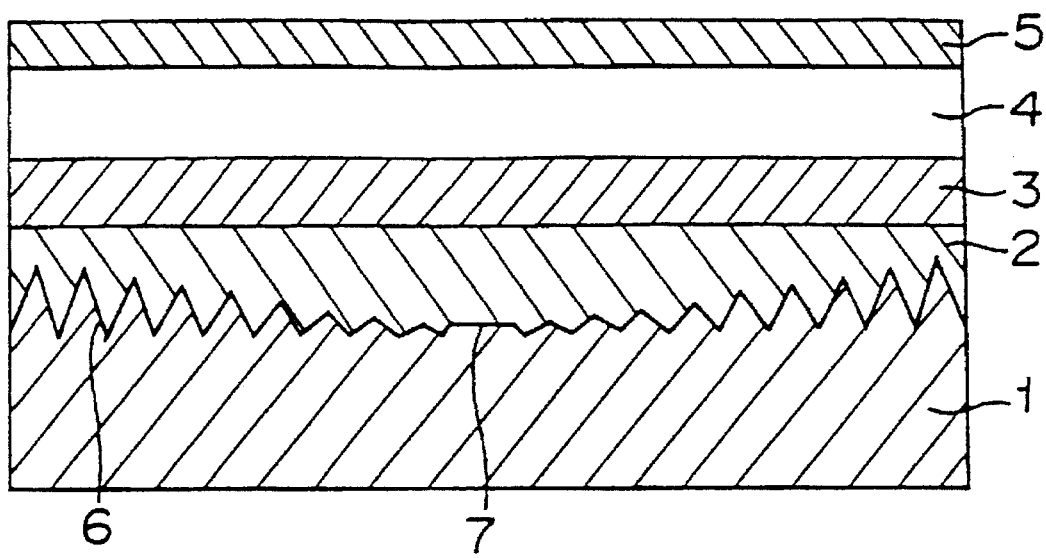
FIG. 19 is a cross-sectional view showing another conventional semiconductor laser.
Figure 20:
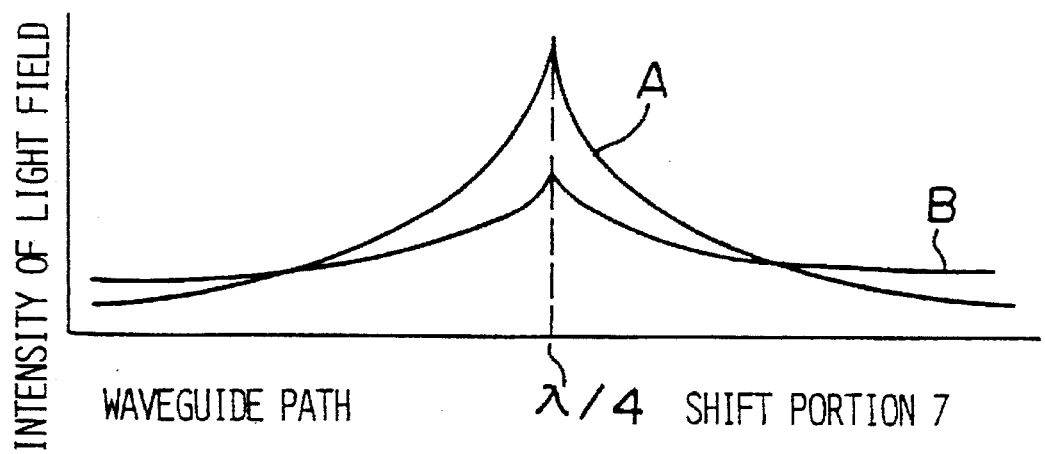
FIG. 20 is a diagram showing the intensity of light at a λ/4 phase shift portion of a semiconductor laser.

In this embodiment, the embedded diffraction grating 19 is between the barrier layer 9 and the buffer layer 8. However, the same effect can be obtained in a semiconductor laser prepared as follows. As shown in FIGS. 16 and 17, on the p type InP substrate 1, the embedded diffraction grating 19 of p type InGaAsP, a barrier layer 9 of p type InP that has the same composition as the p type InP substrate 1, the active layer 3 of InGaAsP, the upper cladding layer 4 of n type InP, and the contact layer 5 of $n^+$ type InGaAsP are successively formed wherein the embedded diffraction grating 19 has a constant pitch Λ, a constant width W, and an amplitude $d_0$ that gradually increases in the direction of the λ/4 phase shift portion 7. In this semiconductor laser, the embedded diffraction grating 19 has a band gap energy larger than that of the active layer 3 but smaller than that of the barrier layer 9, or the refractive index is different from that of the barrier layer 9. Further, in this embodiment, the p type InP substrate 1 is electrically conductive. However, a semi-insulating InP substrate or a semiconductive n type InP substrate may be used. Further, a GaAs series material or the like can also be used.

What is claimed is:

1. A semiconductor laser comprising:

a semiconductor substrate having a band gap energy and a resonator length direction;

an active layer disposed opposite the semiconductor substrate and having a smaller band gap energy than the semiconductor substrate;

a barrier layer on the active layer and having a larger band gap energy than the active layer; and an embedded diffraction grating including a plurality of spaced apart stripes of a semiconductor material, the stripes having a width along the resonator length direction, a length transverse to the resonator length direction, and a thickness, being embedded in the barrier layer, having a constant pitch along the resonator length direction, and a uniform thickness, the width of the stripes gradually changing from stripe to stripe monotonically along the resonator length direction.

2. The semiconductor laser according to claim 1 wherein the embedded diffraction grating includes a centrally located λ/4 shift portion shifting the phase of the embedded diffraction grating by one-quarter wavelength, the width of the stripes becoming gradually smaller toward a center of the λ/4 shift portion.

3. The semiconductor laser according to claim 1 wherein the embedded diffraction grating includes a centrally located λ/4 shift portion shifting the phase of the embedded diffraction grating by one-quarter wavelength, the width of the stripes becoming gradually larger toward a center of the λ/4 shift portion.

4. The semiconductor laser according to claim 1, wherein the refractive index of the embedded diffraction grating is different from that of the barrier layer.

5. The semiconductor laser according to claim 1, wherein the band gap energy of the embedded diffraction grating is larger than that of the active layer and smaller than that of the barrier layer.

6. A semiconductor laser comprising:

a semiconductor substrate having a band gap energy and a resonator length direction;

an active layer disposed opposite the semiconductor substrate and having a smaller band gap energy than the semiconductor substrate;

a barrier layer between the substrate and the active layer and having a larger band gap energy than the active layer; and an embedded diffraction grating including a plurality of spaced apart stripes of a semiconductor material, the stripes having a width along the resonator length direction, a length transverse to the resonator length direction, and a thickness, being embedded in the barrier layer, having a constant pitch along the resonator length direction, and a uniform thickness, the width of the stripes gradually changing from stripe to stripe monotonically along the resonator length direction.

7. The semiconductor laser according to claim 6 wherein the embedded diffraction grating includes a centrally located $\lambda/4$ shift portion shifting the phase of the embedded diffraction grating by one-quarter wavelength, the width of the stripes becoming gradually smaller toward a center of the $\lambda/4$ shift portion.

8. The semiconductor laser according to claim 6 wherein the embedded diffraction grating includes a centrally located $\lambda/4$ shift portion shifting the phase of the embedded diffraction grating by one-quarter wavelength, the width of the stripes becoming gradually larger toward a center of the $\lambda/4$ shift portion.

9. The semiconductor laser according to claim 6 wherein the refractive index of the embedded diffraction grating is different from that of the barrier layer.

10. The semiconductor laser according to claim 6 wherein the band gap energy of the embedded diffraction grating is larger than that of the active layer and smaller than that of the barrier layer.

11. A semiconductor laser comprising:

a semiconductor substrate having a band gap energy and a resonator length direction;

an active layer disposed opposite the semiconductor substrate and having a smaller band gap energy than the semiconductor substrate;

a barrier layer on the active layer and having a larger band gap energy than the active layer; and an embedded diffraction grating including a plurality of spaced apart stripes of a semiconductor material, the stripes having a width along the resonator length direction, a length transverse to the resonator length direction, and a thickness, being embedded in the barrier layer, having a constant pitch along the resonator length direction, and a uniform width, the thickness of the stripes gradually changing from stripe to stripe monotonically along the resonator length direction.

12. The semiconductor laser according to claim 11 wherein the embedded diffraction grating includes a centrally located $\lambda/4$ shift portion shifting the phase of the embedded diffraction grating by one-quarter wavelength, the thickness of the stripes becoming gradually smaller toward a center of the $\lambda/4$ shift portion.

13. The semiconductor laser according to claim 11 wherein the embedded diffraction grating includes a centrally located $\lambda/4$ shift portion shifting the phase of the embedded diffraction grating by one-quarter wavelength, the thickness of the stripes becoming gradually larger toward a center of the $\lambda/4$ shift portion.

14. The semiconductor laser according to claim 11 wherein the refractive index of the embedded diffraction grating is different from that of the barrier layer.

15. The semiconductor laser according to claim 11 wherein the band gap energy of the embedded diffraction grating is larger than that of the active layer and smaller than that of the barrier layer.

16. A semiconductor laser comprising:

a semiconductor substrate having a band gap energy and a resonator length direction;

an active layer disposed opposite the semiconductor substrate and having a smaller band gap energy than the semiconductor substrate;

a barrier layer between the substrate and the active layer and having a larger band gap energy than the active layer; and an embedded diffraction grating including a plurality of spaced apart stripes of a semiconductor material, the stripes having a width along the resonator length direction, a length transverse to the resonator length direction, and a thickness, being embedded in the barrier layer, having a constant pitch along the resonator length direction, and a uniform width, the thickness of the stripes gradually changing from stripe to stripe monotonically along the resonator length direction.

17. The semiconductor laser according to claim 16 wherein the embedded diffraction grating includes a centrally located $\lambda/4$ shift portion shifting the phase of the embedded diffraction grating by one-quarter wavelength, the thickness of the stripes becoming gradually smaller toward a center of the $\lambda/4$ shift portion.

18. The semiconductor laser according to claim 16 wherein the embedded diffraction grating includes a centrally located $\lambda/4$ shift portion shifting the phase of the embedded diffraction grating by one-quarter wavelength, the thickness of the stripes becoming gradually larger toward a center of the $\lambda/4$ shift portion.

19. The semiconductor laser according to claim 16 wherein the refractive index of the embedded diffraction grating is different from that of the barrier layer.

20. The semiconductor laser according to claim 16 wherein the band gap energy of the embedded diffraction grating is larger than that of the active layer and smaller than that of the barrier layer.

* * * * *